(12) United States Patent
Nolan et al.

(10) Patent No.: US 8,697,458 B2
(45) Date of Patent: Apr. 15, 2014

(54) SILICONE COATED LIGHT-EMITTING DIODE

(75) Inventors: Robert J. Nolan, Salisbury, NC (US); Jeffery D. Harman, Sr., Salisbury, NC (US)

(73) Assignee: Shat-R-Shield, Inc., Salisbury, NC (US)

(*) Notice: Subject to any disclaimer, the term of this patent is extended or adjusted under 35 U.S.C. 154(b) by 318 days.

(21) Appl. No.: 13/104,842

(22) Filed: May 10, 2011

(65) Prior Publication Data

US 2011/0210364 A1     Sep. 1, 2011

Related U.S. Application Data

(63) Continuation-in-part of application No. 12/799,238, filed on Apr. 21, 2010.

(60) Provisional application No. 61/214,323, filed on Apr. 22, 2009.

(51) Int. Cl.
*H01L 21/00* (2006.01)

(52) U.S. Cl.
USPC .......................................................... 438/22

(58) Field of Classification Search
USPC .......................................................... 438/22
See application file for complete search history.

(56) References Cited

U.S. PATENT DOCUMENTS

| | | |
|---|---|---|
| 4,499,850 A | 2/1985 | Nolan |
| 4,506,189 A | 3/1985 | Nolan et al. |
| 4,507,332 A | 3/1985 | Nolan et al. |
| 4,738,870 A | 4/1988 | Green et al. |
| 4,804,886 A | 2/1989 | Nolan et al. |
| 5,021,710 A | 6/1991 | Nolan |
| 5,034,650 A | 7/1991 | Nolan |
| 5,043,626 A | 8/1991 | Nolan |
| 5,102,484 A | 4/1992 | Allen et al. |
| 6,284,835 B1 | 9/2001 | Ellison |
| 6,489,637 B1 | 12/2002 | Sakamoto et al. |
| 6,522,067 B1 | 2/2003 | Graff et al. |
| 6,702,638 B2 | 3/2004 | Dupont |
| 7,357,525 B2 | 4/2008 | Doyle |
| 7,572,479 B2 | 8/2009 | Nolan et al. |
| 7,766,529 B2 | 8/2010 | Hadlich et al. |
| 7,791,093 B2 | 9/2010 | Basin et al. |
| 7,829,651 B2 | 11/2010 | Shiobara et al. |
| 7,915,362 B2 | 3/2011 | Ozai |
| 2003/0071366 A1 | 4/2003 | Rubinsztajn et al. |
| 2003/0198830 A1 | 10/2003 | Kim et al. |

(Continued)

FOREIGN PATENT DOCUMENTS

| | | |
|---|---|---|
| CN | 1742390 A | 3/2006 |
| CN | 101148542 A | 3/2008 |

(Continued)

OTHER PUBLICATIONS

"Light-Cap High Performance LED Protection" http://www.dymax.com/pdf/literature/eu_english/lit231eu_light_cap_for_led_protection_ab.pdf, accessed May 9, 2012.

(Continued)

*Primary Examiner* — Anthony Ho
(74) *Attorney, Agent, or Firm* — K&L Gates LLP

(57) ABSTRACT

A silicone protective coating for an electronic light source and a method for applying the coating over an exposed or outer surface of the electronic light source assembled as part of or mounted to a circuit board or other substrate.

14 Claims, 3 Drawing Sheets

(56) References Cited

U.S. PATENT DOCUMENTS

| | | |
|---|---|---|
| 2004/0097006 A1 | 5/2004 | Lowery |
| 2004/0145289 A1 | 7/2004 | Ouderkirk et al. |
| 2004/0246702 A1 | 12/2004 | Yeh |
| 2006/0186428 A1 | 8/2006 | Tan et al. |
| 2007/0114562 A1 | 5/2007 | Radkov et al. |
| 2007/0159062 A1 | 7/2007 | Tsai et al. |
| 2007/0159092 A1 | 7/2007 | Tsai |
| 2007/0298268 A1 | 12/2007 | Haitko |
| 2008/0012465 A1 | 1/2008 | Bolta |
| 2008/0076882 A1 | 3/2008 | Ozai |
| 2008/0117620 A1 | 5/2008 | Hama et al. |
| 2009/0052158 A1 | 2/2009 | Bierhuizen et al. |
| 2009/0057699 A1 | 3/2009 | Basin et al. |
| 2009/0065792 A1 | 3/2009 | Thompson et al. |
| 2009/0123764 A1 | 5/2009 | Morita et al. |
| 2009/0129053 A1 | 5/2009 | Tsai |
| 2009/0179180 A1 | 7/2009 | Morita et al. |
| 2009/0230859 A1 | 9/2009 | Tsai |
| 2010/0195231 A1 | 8/2010 | Suzuki et al. |
| 2010/0270574 A1 | 10/2010 | Nolan et al. |
| 2011/0210364 A1 | 9/2011 | Nolan et al. |
| 2012/0193648 A1 | 8/2012 | Donofrio et al. |
| 2012/0294011 A1 | 11/2012 | Cattoni et al. |

FOREIGN PATENT DOCUMENTS

| | | |
|---|---|---|
| TW | 200716734 A | 5/2007 |
| WO | 2010123557 A1 | 10/2010 |
| WO | 2012016109 A1 | 8/2012 |
| WO | 2012154815 A1 | 11/2012 |
| WO | 2012158841 A1 | 11/2012 |

OTHER PUBLICATIONS

International Search Report for PCT/US2010/01185.
International Search Report for PCT/US2012/037066.
"Light-Cap 9624 Conformal Coating for LEDs", Jan. 2009, http://www.dymax.com/pdf/pds/9624.pdf.
State Intellectual Property Office of People's Republic China Search Report—Application No. 201080018031.X.

SILICONE COATED LIGHT-EMITTING DIODE

CROSS-REFERENCE TO RELATED APPLICATIONS

This is a continuation-in-part application of U.S. patent application Ser. No. 12/799,238, filed Apr. 21, 2010, and also claims the benefit of U.S. provisional patent application Ser. No. 61/214, 323, filed Apr. 22, 2009, each of which is herein incorporated by reference.

FIELD OF THE INVENTION

The present invention relates to a protective coating and a method of applying a barrier or protective coating to an electronic light source such as a light-emitting diode (LED) or an organic light-emitting diode (OLED) and, more particularly, to a method of applying a protective coating over an exposed or outer surface of the electronic light source assembled as part of or mounted to a circuit board or other substrate.

BACKGROUND OF THE INVENTION

There are a variety of solid state lighting technologies involving electronic light sources such as light-emitting diodes (LEDs) and organic light-emitting diode (OLEDs). LEDs and OLEDs have many known advantages over traditional light sources including smaller size, longer lifetime, lower energy consumption, and higher efficiency as measured by its light output per unit power input. The average length of life of a typical LED is estimated to range from 50,000 hours to 100,000 hours. The average length of life depends upon LED quality, system design, operating environment and other factors. Exposure to outside forces should be a consideration in order to protect the circuitry and electronic components of a light-emitting circuit board that comprises an electronic light source such as an LED or OLED for such a duration. However, until now there has not been a solution that effectively addresses or solves the problems associated with the exposure of a light-emitting circuit board to environmental factors such as moisture yet still provides for the known advantages and performance characteristics associated with a LED or OLED.

SUMMARY OF THE INVENTION

The present invention relates to a method of coating an electronic light source including, but not limited to, a light-emitting diode (LED) and an organic light-emitting diode (OLED), referred to generally herein as a LED, and to a method of applying a protective coating over the outer surface of the electronic light source assembled as part of or mounted to a printed circuit board or other substrate. The printed circuit board or substrate may comprise a light engine, an array, or a light module, for example.

Many types of LEDs are commercially available that are mounted onto or as assembled as part of circuit boards and have encapsulates or lenses that are applied over phosphors. These lenses and encapsulates offer little or no protection of the LED or the LED board assembly from environmental contaminants.

In an aspect of the method of the present invention, the method comprises providing non-conductive silicone spray coating to conform to the complete outer surfaces of the attached LEDs, other light-emitting devices and supporting electronic components that are mounted to the printed circuit board to create a sealed protective barrier over and around all surfaces of these said components (including if desired the lens).

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, which are not necessarily to scale, wherein.

DETAILED DESCRIPTION OF THE INVENTION

The following detailed description of the embodiment(s) is merely exemplary in nature and is in no way intended to limit the invention, its application, or uses.

Figure 1:
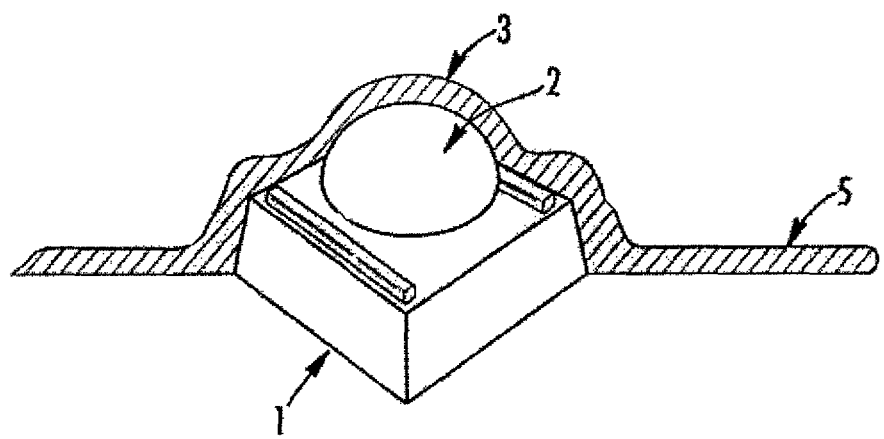
FIG. 1 illustrates a light-emitting diode (LED) mounted to a circuit board or substrate having been completely coated on the outer surface of the board and LED (including the lens) in accordance with aspects of the present invention.

Referring now to the Figures, FIG. 1 illustrates a solid state light-emitting diode (LED) 1 having been mounted to or assembled as part of a printed circuit board or substrate (not shown). A lens 2 is attached to the LED 1. As shown in FIG. 1, the LED 1 and the LED lens 2 have been completely coated on their outer surfaces (coating shown at location 3) and the board has been coated on its outer surface (coating shown at location 4) in accordance with aspects of the present invention.

Figure 2A:
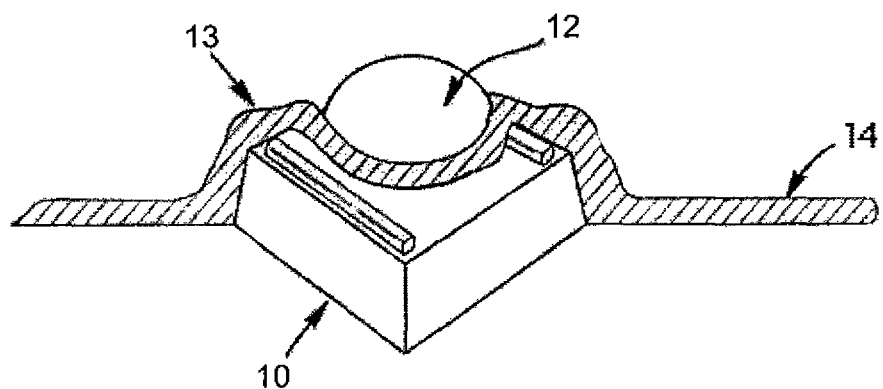
FIG. 2A illustrates a light-emitting diode (LED) mounted to a circuit board or substrate and a portion of the lens of the LED has been partially coated in accordance with aspects of the present invention.

FIG. 2A illustrates a light-emitting diode (LED) 10 mounted to a circuit board or substrate and a portion of the lens 12 of the LED 10 has been partially coated with coating 13 as well as the printed circuit board having been coated on its outer surface as shown at location 14 in accordance with aspects of the present invention.

Figure 2B:
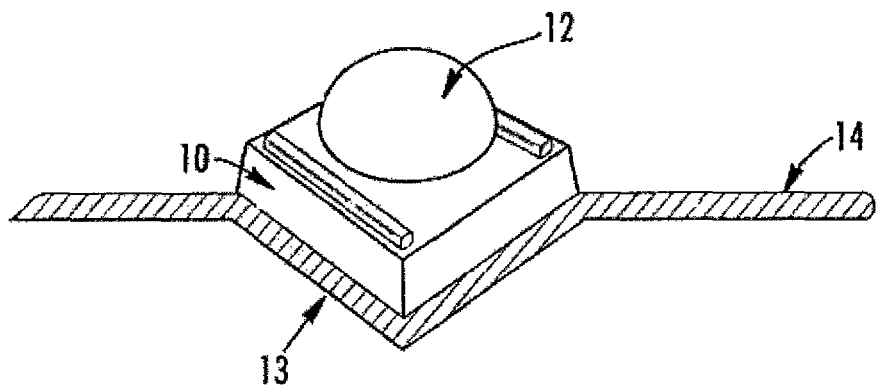
FIG. 2B illustrates a light-emitting diode (LED) mounted to a circuit board or substrate such that the circuit board or substrate has been coated, excluding the LED and lens, in accordance with aspects of the present invention.

FIG. 2B illustrates a light-emitting diode (LED) 10 mounted to or assembled as part of a printed circuit board or substrate (not shown) wherein the board, excluding the LED 10 and lens 12, has been coated on its outer surface (coating shown at location 14) in accordance with aspects of the present invention. The coating is applied around the LED as shown at location 13.

Figure 3:
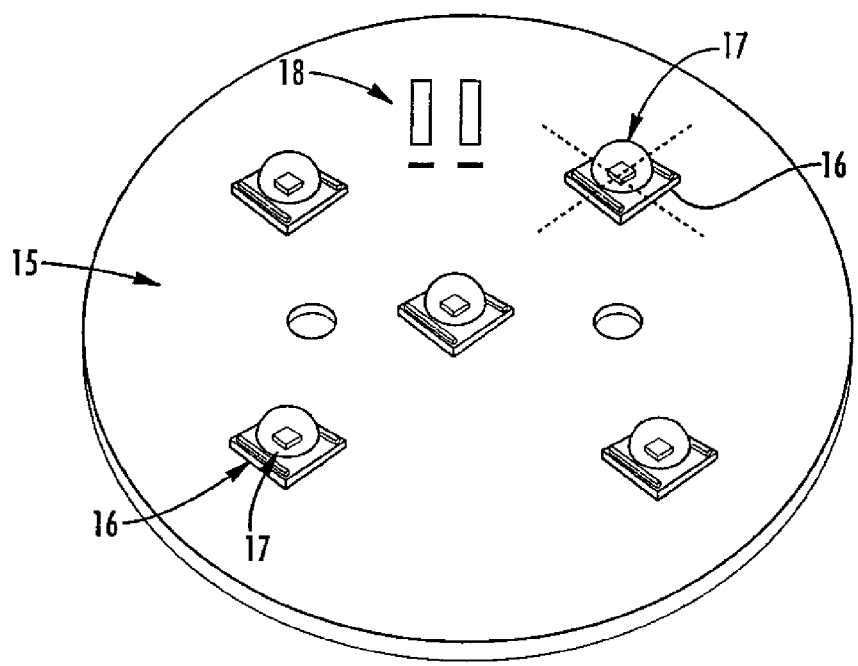
FIG. 3 illustrates a circuit board or substrate suitable for use in accordance with aspects of the present invention.

FIG. 3 illustrates a printed circuit board or substrate 15 suitable for use in accordance with aspects of the present invention.

Figure 4:
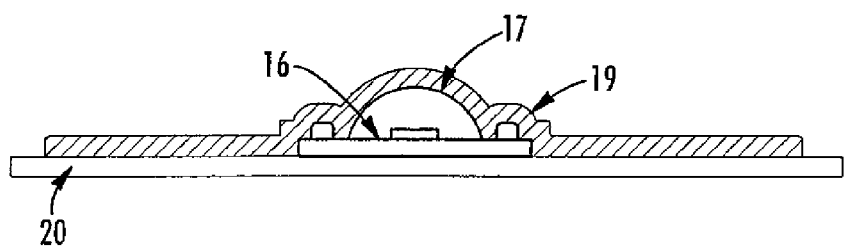
FIG. 4 is a side view illustrating a LED mounted to a circuit board or substrate of FIG. 3 and having been coated on the outer surface of the board and LED (including the lens) in accordance with the present invention.

FIG. 4 is a side view illustrating a LED mounted to or assembled as part of a circuit board or substrate of FIG. 3 and having been coated on the outer surface of the board 20 and LED 16 (including the lens 17) in accordance with the present invention.

Figure 5:
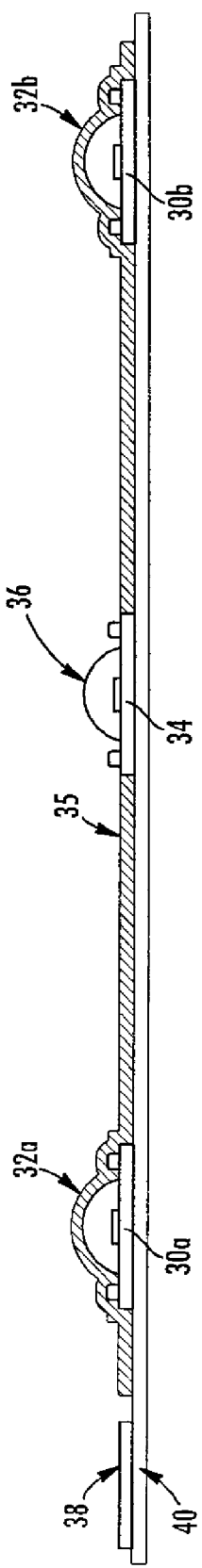
FIG. 5 is a side view illustrating multiple LEDs mounted to a circuit board or substrate with certain LEDs having been selectively coated on the outer surface (including the lens) and others not having been coated on the outer surface in accordance with aspects of the present invention.

FIG. 5 is a side view illustrating multiple LEDs (30a, 34 and 30b) mounted to or assembled as part of a circuit board or substrate 40 with certain LEDs (30a and 30b) having been selectively coated on their outer surfaces (including the lenses 32a and 32b) and other LEDs 36 not having been coated on their outer surfaces in accordance with aspects of the present invention. FIG. 5 also illustrates the circuit board or other substrate 40 having been coated on its outer surface (as shown at location 35).

The present invention relates to a method of coating an electronic light source such as a LED and electronic circuitry that is mounted onto printed circuit boards or similar substrates. The electronic light source comprises a lens or an encapsulate that is typically made of glass or another material to cover the phosphor and the electronic circuitry. In accordance with the method of coating and the coating of the present invention, a coating is applied on the circuit board to form a protective barrier or film. This coating is in addition to and is applied over any existing lens or encapsulate that is present on the existing light emitting electronic light source. The method of the present invention provides protection from adverse environmental conditions especially moisture which can corrode, accelerate, and cause a partial or complete failure of the electronic circuit board or lighting module. Thus, the coating of the present invention has the capability of sealing the entire board to prevent this corrosion from environmental conditions that lead to premature failure of LED boards and circuitry. The coating adds physical strength to the existing attached lens when it is applied and coated over the LED.

It is surprising that in accordance with the method of the present invention, the coating of the present invention can be applied to existing LED devices which can include lenses and encapsulates as typically it is disadvantageous to cover over the top of these components due to discoloration which can change the light and color rendering index of the LED output characteristics. The coating of the present invention optionally covers the lens yet does not disadvantageously affect the light and color rendering index of the LED output characteristics.

Furthermore, the coating composition of the present invention applied to the electronic light source is also advantageous because of its non-yellowing properties and optically clear formulation that lasts for the life of the LED. The coating as applied to the LED and circuit board of the present invention provides a solution to the problems associated with moisture management while minimizing or eliminating yellowing and loss of lumen output of the LED. The coating having been applied to the LED boards forms a clear or transparent film that minimizes or eliminates yellowing and the loss of lumen output generated by the LED.

In accordance with the present invention, the formed protective barrier layer mitigates or prevents moisture penetration and hence, reduces or eliminates degradation of the LED due to moisture penetration and, hence, reduces or eliminates degradation of the LED due to moisture or other environmentally degrading elements such as but not limited to water, dust, heat and salt spray.

The method of the present invention is suitable for use with numerous types, sizes, and shapes of LED boards having an exposed surface to be coated. There are any number of known types and sizes of LEDs that are commercially available to one of ordinary skill in the art and that could be readily used in accordance with the method of the present invention.

The method of the present invention comprises providing a LED board having an exposed surface to be coated. There are numerous commercial suppliers of LEDs. Examples of such commercial suppliers are Seoul Semiconductor, Cree, Inc., Lumileds and Osram Sylvania. An LED suitable for use in the present invention is a white, colored, or multi-colored LED. The particular LED selected often depends upon the desired end-use application. However, one of ordinary skill in the art would know which LEDs are suitable for a given end-use application. The method of the present invention is particularly suitable for any outdoor end-use application or any non-conditioned environment. For example, outdoor signage and street lights are non-limiting examples of potential end-use applications for the coated LED of the present invention.

Prior to coating the LED and LED board, the LED is prepared by identifying the areas that will not be coated such as the connecting solder pads 38 as shown in FIG. 5. In accordance with the present invention, areas to remain uncoated areas can be selectively programmed in accordance with the system and method of the present invention. Masking or avoiding these keep out areas ensure, for example, that when the power leads are soldered to the connecting solder pads on the printed circuit board there is a clean copper pad without any coating on it.

The method of the present invention comprises coating an exposed surface or a portion of an exposed surface of a LED board with a coating composition. The coating acts as a barrier layer and conforms to the shape of the LED and its components. Based upon the spraying technology discussed herein, it is not necessary to mask the electrodes (leads) or other areas may be designated. The spraying technology has computer programmable capabilities that allow the coating to selectively applied around specified components and completely omit them with the liquid spray or to apply spray over 100% of the board.

In another aspect of the present invention, the coating composition comprises silicone. In yet another aspect of the present invention, the coating composition is in the form of a liquid.

The coating composition of the present invention preferably comprises at least 60 weight percent (wt %) of a silicone elastomer, preferably at least 99 wt % of a silicone elastomer. A suitable coating for use in the present invention further comprises from 0 to 40 wt % of diisopropoxy di(ethoxyacetoacetyl) titanate, alkoxysilane reaction product, methyl alcohol, or a combination thereof.

Examples of suitable commercially available silicones include, but are not limited to, silicones available from Humiseal, silicones available from Dow Corning such as DOW CORNING® 3-1953 Conformal Coating, and silicones available from Shin Etsu such as X-832-407, 409 and 424.

In a method of the present invention, the coating composition is applied by spraying the liquid silicone coating composition onto the exposed or outer surface or a portion of an exposed or outer surface of the LED board to coat the LED and its lens. The LED is preferably sprayed at ambient conditions. The LED or LED board can be coated without any composition other than the coating itself being applied to the LED or LED board. The LED and LED board can be coated without the use of an adhesion promoter. The LED may be sprayed in a spray booth.

The liquid coating composition is preferably sprayed with an air-assisted airless spray system or a bead and air swirl system. A bead and air swirl system applies the silicone coating as a bead and uses air to create a swirl pattern. The latter system is desirable because of its improvement in transfer efficiency and because such a system provides good coverage with little bounce back of the liquid spray. The silicone coating can be sprayed at ambient conditions. The LED shape is programmed into the spray system with the exact area to coat and the area to leave uncoated. Since spray time is based upon the size and shape of the LED, spray times vary up to about twenty seconds. The thickness of the silicone coating is typically in a range of 5 to 8 mils. Examples of commercially available spray systems include, but are not limited to, Asymtek of Nordson Corporation or systems available from PVA.

Other advantages of the system of the present invention include, but are not limited to, the capability to apply small amounts of silicone in small, precise selective areas. This is accomplished using the aforementioned computer programming capabilities to select the appropriate valve to dispense the liquid into the desired area. The selective coating capability allows for an angular lens to be applied to the board without contaminating the lens and its lumen output. The LED is placed on a transfer belt and sprayed at ambient conditions in a spray booth. The LED is transported via the belt to a curing oven.

Subsequent to being spray coated, the coated LED is cured. Curing typically occurs in a forced air oven for curing for a silicone coating. The LED is exposed to 200 to 350 degrees F. for approximately 10 to 15 minutes. The system is designed around the use of hot air being impinged on the LED. As the LED exits the curing oven, the LED is cooled in ambient conditions. The masking on the electrodes (leads) is removed if the selective process was not programmed.

The production rate of coated LEDs varies depending upon the size and shape of the LED as well as its end-use application. For example, the production rate varies depending upon whether there is linear or down lighting. Based upon the end-use application, typical production speeds may vary between 90 to 150 parts per hour.

As indicated herein, a silicone composition spray coated on the LED board provides a transparent moisture management system that lasts the length of life for the LED yet minimizes or eliminates yellowing and loss of lumen output. The liquid spray coating method is particularly desirable as compared to other coating methods that might otherwise be available. For example, it was determined from experimentation that it was difficult to get an even coating as well as a smooth coating with a powder spray. For example, the powder coatings cured with a convection oven were grainy and the LED detached from its base due to the curing temperature, thus creating aesthetic and performance failures.

Advantages of the silicone coating composition and method of the present invention include, but are not limited to, the silicone composition does not deteriorate with ultraviolet (UV) light, silicone remains flexible and can withstand higher temperatures up to 400° F., and the silicone composition either eliminates yellowing or yellows less as compared to other coating compositions.

An additional benefit of the present invention is that its unique anti-yellowing properties allow for the protective coating material to be coated over the existing LED or electronic light source surfaces and offer substantial thermal and mechanical strength without adverse long term effects to the lighting color and output.

The method of the present invention may further comprise adding a colorant to the protective coating to offer aesthetic advantages for the final assembled lighting module or fixture. This colored coating would be dispensed around all of the non-light producing surfaces and meld with the optically clear conformal coating that is dispensed over the LED or light producing areas.

EXAMPLES

Sample LED boards of various shapes and sizes were spray coated with liquid silicone. Two trials were run. One trial used the Asymtek SL-940E spray system. The other trial used the PVA 2000. Selective Coating System. Each trial tested LED boards spray coated with a silicone product manufactured by Dow Corning, DOW CORNING® 3-1953 Commercial Conformal Coating, and LED boards coated with a liquid silicone available from Shin Etsu, X-832-407.

LED boards were independently tested for environmental and electrical testing as well as Lumen maintenance. Lumen maintenance refers to the amount of light lost due to the coating process. All tests were conducted by independent third party laboratories. The test results are listed below:

TABLE 1

| Test | Test Method | Specification | Functional Performance | Color Change | Cracking |
|---|---|---|---|---|---|
| Humidity Exposure | UL 8750 | Section 8.12 | PASS | NO | NO |
| Dielectric 1 | UL 8750 | Section 8.12 | PASS | NO | NO |
| Corrosion Test/Salt Spray | UL 50E | Section 8.7 | PASS | NO | NO |
| Water Immersion (IP-68) | IEC 60529 | Section 14.2.7 | PASS | NO | NO |
| Thermal Shock | Non Standard | Customer Specified | PASS | YES | NO |
| Lumen Loss | | | 6-7% | | |
| CRI (Color Rendering Index) | | | 72 | 74 | |
| CCT (Correlated Color Temperature) | | | 4200 K | 4600 K | |

All test results indicate that the coating is stable to Humidity Exposure and Corrosion and Salt Spray. It has also been shown that the silicone coated LEDs pass IP-68 testing. While CRI and CCT show an improvement and are well controlled, the average lumen loss is 6-7%.

TABLE 2

| Test Equipment: | | |
|---|---|---|
| Equipment Used | Model Number | Control Number |
| Envirotronics | SSH32-c | H190 |
| Thermotron | SM-32C | H147 |
| Despatch | LAC1-67 | H138 |
| Omega | 650-TF-DDS | T036 |
| Singleton Corp | SCCH22 | H168 |
| Atago Co | ES-421 | M185 |
| Oakton | WD-25624-86 | I027 |
| Pyrex | 3062-100 | B046 |

TABLE 2-continued

Test Equipment:

| Equipment Used | Model Number | Control Number |
|---|---|---|
| Biddle | 230425 | V178S |
| Fisher Scientific | 14-649-9 | N1132 |
| Fluke | 87V | M207 |
| Stanley | 33-428 | U011 |
| Water Tank | N/A | N/A |

TABLE 3

LED Sample Boards:

| Sample Number | Description | Model Number |
|---|---|---|
| 203303-1 | PCB 6 LED'S | CREE 5 |
| 203303-2 | PCB 102 LED'S | Sylvania 102-2 |
| 203303-3 | PCB 4 LED'S | Philips 1 |
| 203303-4 | PCB 6 LED'S | CREE 4 |
| 203303-5 | PCB 102 LED'S | Sylvania 102-3 |
| 203303-6 | PCB 4 LED'S | Philips 3 |
| 203303-7 | PCB 6 LED'S | CREE 6 |
| 203303-8 | PCB 54 LED'S | Sylvania 54-3 |
| 203303-9 | PCB 4 LED'S | Philips 4 |
| 203303-10 | PCB 6 LED'S | CREE 7 |
| 203303-11 | PCB 54 LED'S | Sylvania 54-5 |
| 203303-12 | PCB 4 LED'S | Philips 2 |
| 203303-13 | PCB 102 LED'S | Sylvania 102-5 |

The following tests were conducted to determine the functionality and lumen performance of the silicone coated LEDs. All testing was conducted by third party independent laboratories. Intertek, which is located in Cortland, N.Y., conducted the Environmental and Electrical testing. ITL, located in Boulder, Colo., conducted the lumen maintenance testing.

Intertek performed the following tests:

TABLE 4

| Humidity Exposure | UL 8750 | Section 8.12 |
|---|---|---|
| Corrosion Test/Salt Spray | UL 50E | Section 8.7 |
| Water Immersion | IEC 60529 | Section 14.2.7 |
| Thermal Shock | Non Standard | Customer Specified |

Humidity Exposure UL 8750 Section 8.12:

A unit for use in damp or wet locations was exposed for 168 hours to moist air having a relative humidity of 88±2 percent at a temperature of 32.0±2.0° C. (89.6±3.6° F.). All of the samples were functional following the test. A dielectric test was performed which applied 500 Vdc for one (1) minute to test the coating on the samples. The test was conducted in a manner where the test leads were placed directly on the PCB's coating. All the samples were functional following the test. A visual check was also performed. The coating of the sample had not deteriorated and there was no change to the color or cracking.

Corrosion Test/Salt Spray UL 50E Section 8.7:

Test samples were subjected to corrosion test at the atmosphere described below for 24 hours and then the functional tests were performed.

TABLE 5

| Salinity | pH | Fallout | Temperature |
|---|---|---|---|
| 5.5% | 6.6 | 1.4 to 1.5 ml/h | 95° F. |

Following the functional tests, the samples were subjected to 144 hours of corrosion testing at the atmosphere described below and then function tests were performed.

TABLE 6

| Salinity | pH | Fallout | Temperature |
|---|---|---|---|
| 5.5% | 6.6 | 1.4 to 1.5 ml/h | 95° F. |

All samples were functional following the test. A visual check was performed. The coating of the sample had not deteriorated and there was no change of color or cracking.

Water Immersion IEC 60529 Section 14.2.7:

Samples were completely immersed in water to a level between 850 mm and 1000 mm for thirty minutes. Following the test, functional tests were performed. All samples were functional following the test. A visual check was performed. The coating of the sample had not deteriorated and there was no change of color or cracking.

Thermal Shock, Non-Standard, Customer Specified:

Samples should perform after rapidly changing temperatures from −40° C. to 150° C. Samples were subjected to five cycles. One cycle consisted of one (1) hour at 150° C. then one (1) hour at −40° C. with a transfer rate of less than one (1) minute. All samples were functional following the test. A visual check was performed. The coating of the sample had not deteriorated and there was change of color from clear to a tan color on all samples. There was no cracking of the coatings.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements.

What is claimed is:

1. A method of making a coated electronic light source, the method comprising:
   providing an electronic light source mounted on a printed circuit board, wherein the electronic light source comprises a lens having an outer surface; and
   applying a coating comprising silicone to the printed circuit board having the electronic light source mounted thereon to form a sealed protective barrier.

2. The method according to claim 1, wherein the electronic light source is a light-emitting diode or an organic light-emitting diode.

3. The method according to claim 1, wherein the coating is applied by spray coating.

4. The method according to claim 3, wherein the spray coating conforms to the surface of the light-emitting diode.

5. The method according to claim 3, further comprising spraying the coating with an air-assisted airless system or a bead and air swirl system.

6. The method according to claim 1, wherein the coating covers the lens.

7. The method according to claim 1, wherein the coating comprises at least 60 weight % silicone.

8. The method according to claim 7, wherein the coating further comprises from 0 to 40 weight % of diisopropoxy di(ethoxyacetoacetyl) titanate, alkoxysilane reaction product, methyl alcohol, or a combination thereof.

9. The method according to claim 1, wherein the coating comprises at least 99 weight % silicone.

10. The method according to claim 9, wherein the coating further comprises from 0 to 1 weight % of diisopropoxy di(ethoxyacetoacetyl) titanate, alkoxysilane reaction product, methyl alcohol, or a combination thereof.

11. The method according to claim 1, further comprising curing the silicone coated light-emitting diode.

12. The method according to claim 11, wherein curing is with radiant heat.

13. The method according to claim 11, wherein curing is in a forced air oven.

14. The method according to claim 1, wherein the coating is transparent.

\* \* \* \* \*